(12) United States Patent
Sampson

(10) Patent No.: US 6,317,967 B1
(45) Date of Patent: Nov. 20, 2001

(54) SYSTEM FOR EXTRACTING CIRCUIT CARDS FROM A CIRCUIT CARD CARRIAGE

(75) Inventor: Gary W. Sampson, Cedar Rapids, IA (US)

(73) Assignee: Rockwell Collins, Cedar Rapids, IA (US)

( * ) Notice: Subject to any disclaimer, the term of this patent is extended or adjusted under 35 U.S.C. 154(b) by 0 days.

(21) Appl. No.: 09/399,244

(22) Filed: Sep. 20, 1999

(51) Int. Cl.[7] ................................................... B23P 19/00
(52) U.S. Cl. .............................. 29/729; 29/830; 312/101; 312/321
(58) Field of Search .............................. 29/842, 830, 831, 29/729; 312/321, 101

(56) References Cited

U.S. PATENT DOCUMENTS 4,256,356 * 3/1981 Roth .

* cited by examiner

*Primary Examiner*—Carl J. Arbes
(74) *Attorney, Agent, or Firm*—Nathan O. Jensen; Kyle Eppele

(57) ABSTRACT

An avionics LRU having multiple circuit cards therein which are arranged in readily accessible slots and have insertion/extraction apparatuses coupled thereto which use a rack and pinion arrangement to provide a relatively high insertion force over an increased displacement.

10 Claims, 3 Drawing Sheets

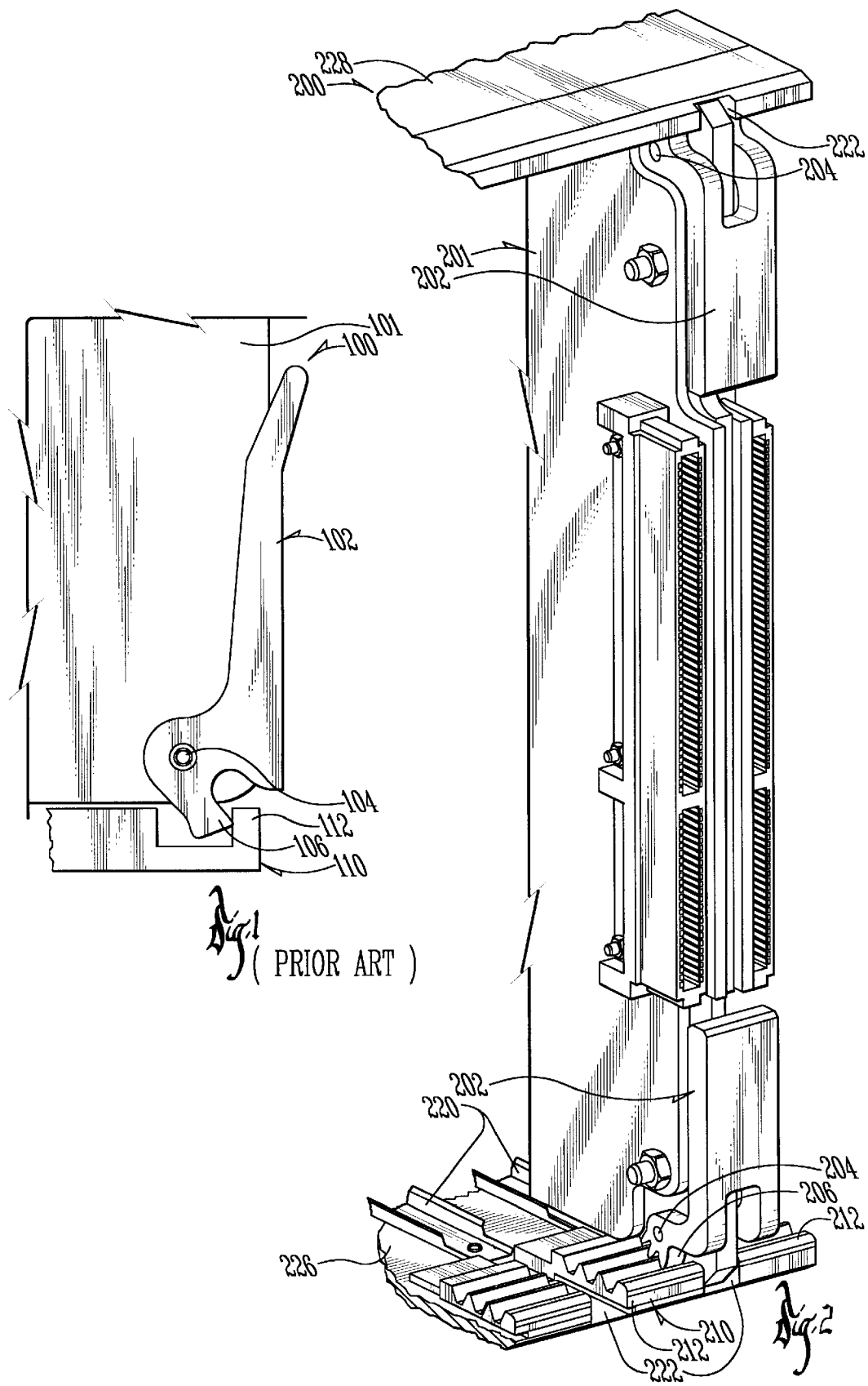

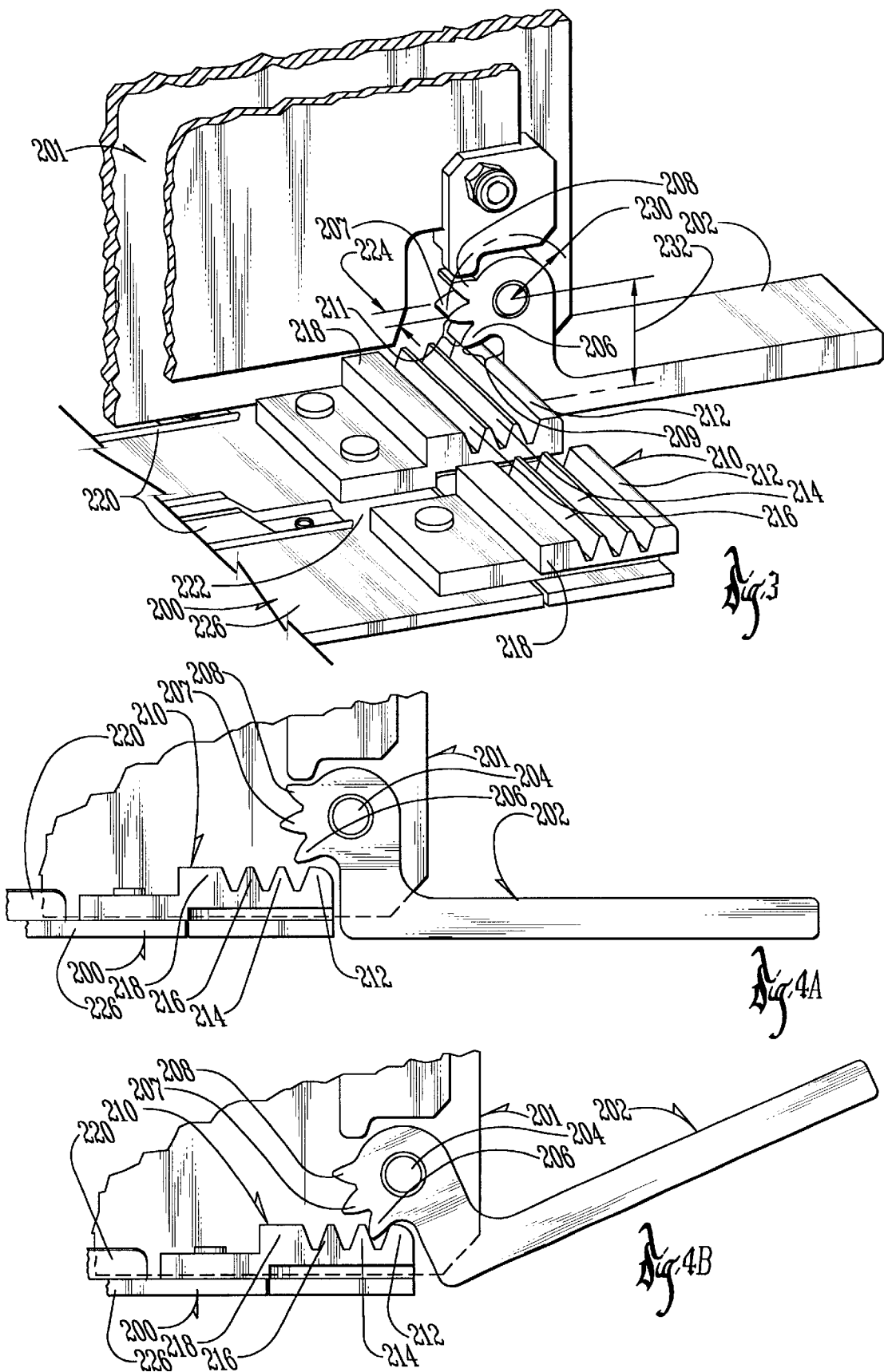

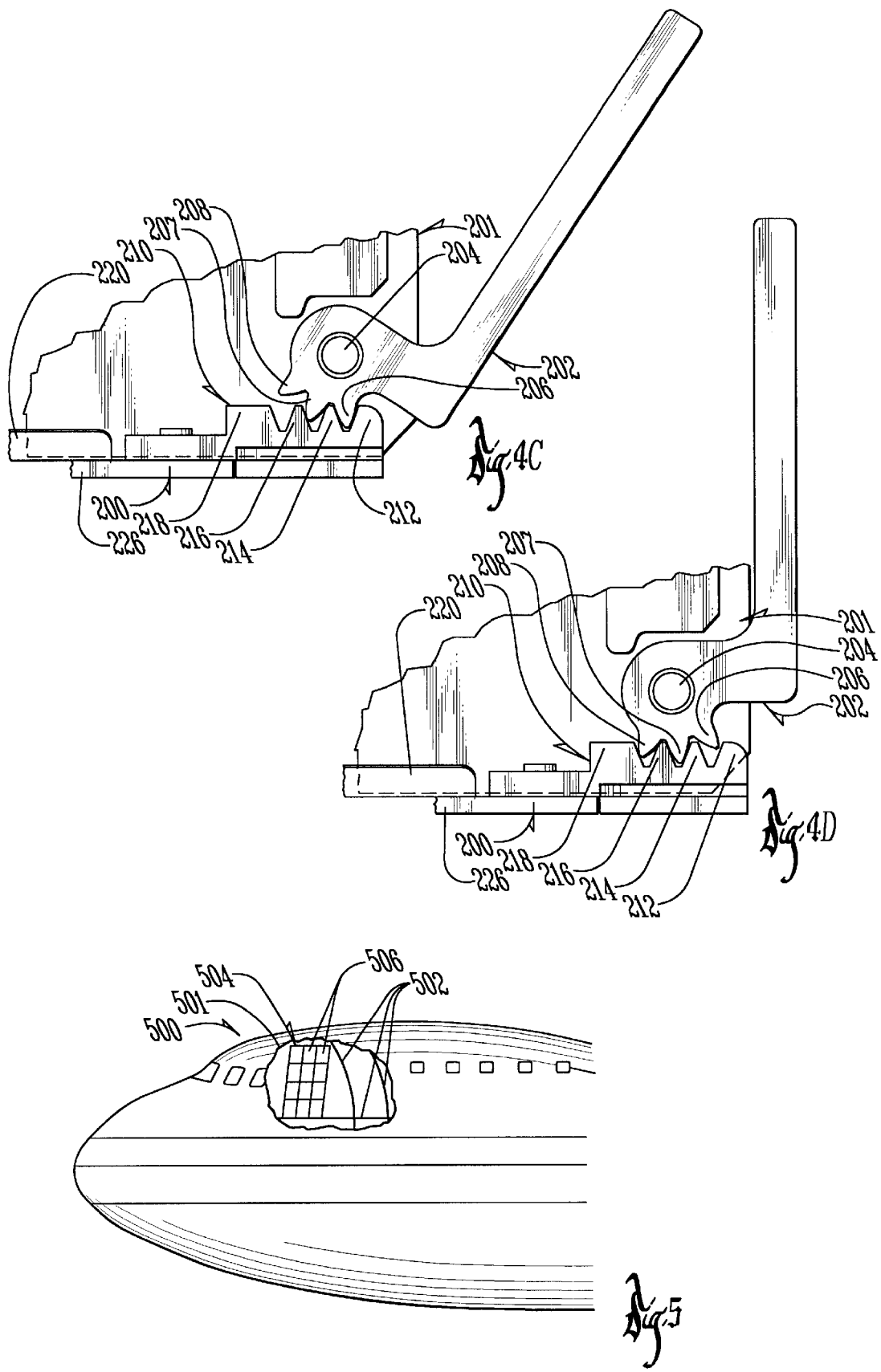

SYSTEM FOR EXTRACTING CIRCUIT CARDS FROM A CIRCUIT CARD CARRIAGE

FIELD OF THE INVENTION

The present invention generally relates to aviation electronics, or avionics, and more particularly relates to multi-card avionics boxes, and even more particularly relates to a system and method for extracting circuit cards from avionics boxes having blind mated circuit cards therein.

BACKGROUND OF THE INVENTION

In the past, designers of avionics systems have endeavored to provide systems with improved reliability and improved serviceability. One crucial element in such systems has been the use of spare component parts, including field replaceable spare circuit cards. These field replaceable circuit cards allow for repair of avionics equipment without extended downtimes which are often associated with sending an avionics LRU to a service center for repair. One common method of assisting in quick removal of circuit cards has been the use of pivoting cam extractors, which are attached to the circuit card and pivoted to create a camming action, causing motion of the circuit card away from a connector in the LRU.

While these pivoting camming extractors have many advantages, often including low cost and ease of manufacture, they also have significant drawbacks.

First of all, the pivoting camming extractors often result in extraction or insertion forces which have significant components in directions other than the desired direction of insertion or extraction.

Secondly, the insertion and extraction forces often approach or exceed the force limits of these cam extractors, especially with circuit cards having high pin counts and limited displacements. Consequently, there exists a need for improvement in systems and methods for inserting and extracting circuit cards.

SUMMARY OF THE INVENTION

It is an object of the present invention to provide enhanced reliability for avionics boxes having extractable circuit cards therein.

It is a feature of the present invention to include a multi-tooth rack and pinion arrangement.

It is an advantage of the present invention to reduce the undesired extraction forces in a direction other than the primary direction of travel of the circuit card during the insertion and/or extraction process.

It is another advantage of the present invention to increase the mechanical advantage of the extractor for generating strong insertion and extraction forces required for circuit cards with high pin counts, and at the same time, maintaining or increasing the displacement insertion or extraction.

It is yet another advantage of the present invention to improve the reliability of avionics boxes by reducing pin damage during insertion.

The present invention is an apparatus and method for inserting circuit cards in circuit card cases, such as, but not limited to, avionics LRUs, which are designed to satisfy the aforementioned needs, provide the previously stated objects, include the above-listed features, and achieve the already articulated advantages. The present invention is carried out with a "cam-less extractor" in a sense that the amount of undesired pivoting of the circuit card during insertion and extraction has been greatly reduced.

Accordingly, the present invention is a system and method for inserting and extracting circuit cards from a case by use of a multi-toothed rack in association with a pivoting toothed member.

BRIEF DESCRIPTION OF THE DRAWINGS

The invention may be more fully understood by reading the following description of the preferred embodiments of the invention, in conjunction with the appended drawings wherein:

FIG. 1 is a simplified perspective diagram of an extractor and environment of the prior art.

FIG. 2 is a perspective view of a pair of extractors of the present invention, together with the environment in which they would be used.

FIG. 3 is an enlarged perspective view of an extractor of the present invention in a disengaged state.

FIG. 4A is a side view of an extractor of FIG. 2 shown disposed in a disengaged state.

FIG. 4B is a side view of an extractor of FIG. 2 shown disposed in a state intermediate of that shown in FIGS. 2 and 3, and intermediate of that shown in FIGS. 4A and 4C.

FIG. 4C is a side view of an extractor of FIG. 2 shown disposed in a state intermediate of that shown in FIGS. 2 and 3, and intermediate of that shown in FIGS. 4B and 4D.

FIG. 4D is a side view of an extractor of FIG. 2 shown disposed in an engaged state.

FIG. 5 is a cutaway view of portions of an aircraft of the prior art.

DETAILED DESCRIPTION

Now referring to the drawings, wherein like numerals refer to like matter throughout, and more particularly to FIG. 1, there is shown a system of the prior art, generally designated 100, which includes a circuit card 101 for insertion into an avionics box, not shown. A lever handle 102 is coupled through lever handle pivot pin 104 to circuit card 101, and a camming action occurs when lever handle 102 pivots about lever handle pivot pin 104 and lever handle tooth 106 engages chassis rack 110 with a chassis rack tooth 112 thereon. These camming extractors are well known in the art.

Now referring to FIG. 2, there is shown an avionics box 200 of the present invention having a chassis slot 220 therein for coupling with a circuit card 201. Coupled to circuit card 201 is a lever handle 202. FIG. 2 shows the circuit card 201 having bottom and top extractors which are preferably identical to each other and are disposed adjacent to avionics box bottom 226 and avionics box top 228 respectively. The description herein is equally applicable to either the top or bottom of circuit card 101. Lever handle 202 pivots about lever handle pivot pin 204, thereby causing lever handle first tooth 206 to interact with chassis rack member 210 and chassis rack member first tooth 212 thereon. Circuit card 201 is shown in a chassis slot 220. Two chassis slots are shown; however, it should be understood that numerous chassis slots may be included depending upon the particular design requirements. Circuit card 201 slides through a rack slot 222, which is an interstice between adjacent chassis rack members 210 and then is further slid into chassis slot 220.

Now referring to FIG. 3, there is an enlarged perspective view of the apparatus of FIG. 2, showing additional detail.

The apparatus is shown in a disengaged state, meaning that the circuit card 201 is free to slide in chassis slot 220 because there is no contact between lever handle first tooth 206, lever handle second tooth 207, and lever handle third tooth 208 and the chassis rack member 210. Together lever handle first tooth 206, lever handle second tooth 207, lever handle third tooth 208, and lever handle 202 may be viewed as a pinion for cooperation with a rack. Chassis rack member 210 is shown having a chassis rack member first tooth 212, which is preferably wider than chassis rack member second tooth 214 and chassis rack member third tooth 216. The purpose of the extra width of chassis rack member first tooth 212 is to assure that proper alignment of lever handle first tooth 206 occurs with respect to the chassis rack member 210. Chassis rack member first tooth 212 is of sufficient girth that it will mesh with initial lever handle gap 209, but it will not mesh with second lever handle gap 211. This prevents a situation where circuit card 201 might otherwise be inserted into chassis slot 220 while lever handle 202 is already disposed in a partially closed orientation where one of lever handle second tooth 207 or lever handle third tooth 208 might have been the initial gear tooth which meshes with chassis rack member 210. This would typically result in an insertion of circuit card 201 to a point which is less than a normal full insertion. Chassis rack member fourth tooth 218 is included for assistance in extraction of said circuit card 201. Lever handle first tooth 206, lever handle second tooth 207, and lever handle third tooth 208 may have a lever handle gear tooth width dimension 224 which is in excess of a width characteristic of rack slot 222, so that lever handle first tooth 206, lever handle second tooth 207, and lever handle third tooth 208 are capable of engaging adjacent chassis rack members 210 (see FIG. 2). Circuit card 201 has a predetermined level of insertion forces and displacement necessary to fully insert circuit card 201 via chassis slot 220 into avionics box 200. The pitch radius 230 is designed to provide the appropriate level of mechanical advantage to result in the necessary insertion forces. The dimensions of lever handle radius 232 and pitch radius 230 are effectively matched to the predetermined level of necessary insertion forces for said circuit card 201.

In operation, and now referring to FIGS. 4A–4D, the present invention operates as follows:

Circuit card 201 is inserted into chassis slot 220 with lever handle 202 disposed as shown in FIG. 4A. Lever handle first tooth 206 is not yet meshed with chassis rack member 210. As lever handle 202 is progressively raised through positions shown in FIG. 4B and FIG. 4C, circuit card 201 is caused to translate along chassis rack member 210 until it reaches its desired location when lever handle 202 is disposed as shown in FIG. 4D. The details of dimensions and relative locations of the various parts of the apparatus of the present invention are expected to be tailored in well-known ways to accommodate predetermined levels of insertion forces and predetermined levels of mechanical advantage and displacement.

Now referring to FIG. 5, there is shown a cutaway view of an aircraft of the prior art, generally designated 500, having a cutaway portion 501 exposing a structural frame 502 and an avionics rack 504 having at least one avionics receiving station 506 therein for receiving a typical avionics line replaceable units (LRUs) or an avionics box 200 of the present invention, which preferably has connectors thereon which are similar, if not identical, to connectors for coupling prior art avionics LRUs with avionics rack 504. The present invention is described herein in an aviation and avionics environment because it is believed that the beneficial aspects of the invention will be readily appreciated in such an environment. However, it should be understood that the circuit card insertion apparatus and slots, etc. of the present invention, can be used in any type of electronics equipment, and it is the intention of the present invention to include these other non-avionics equipment types.

It is thought that the method and apparatus of the present invention will be understood from the foregoing description and that it will be apparent that various changes may be made in the form, construct steps, and arrangement of the parts and steps thereof without departing from the spirit and scope of the invention or sacrificing all of their material advantages. The form herein described is merely a preferred exemplary embodiment thereof.

I claim:

1. An avionics system comprising:

an avionics rack disposed on an aircraft, said rack having a plurality of receiving stations therein for receiving avionics LRUs;

a multi-card avionics LRU disposed in one of said receiving stations;

a circuit card, disposed in said multi-card avionics LRU, said circuit card having disposed thereon a lever handle which is coupled to said circuit card through a lever handle pivot pin;

mechanically coupled with said lever handle is a lever handle first tooth and a lever handle second tooth;

a chassis rack member disposed in said multi-card avionics LRU, said chassis rack member having a chassis rack member first tooth, and a chassis rack member second tooth thereon; and wherein said chassis rack member first tooth has a width characteristic which is in excess of a width characteristic of said chassis rack member second tooth.

2. An avionics system of claim 1 wherein said lever handle first tooth and said lever handle are separated by an initial lever handle gap which is sufficiently large to allow lever handle and lever handle first tooth to be disposed on opposing sides of said chassis rack member first tooth.

3. An avionics system of claim 2 wherein said lever handle first tooth and said lever handle second tooth are separated by a second lever handle gap which is insufficient to permit lever handle first tooth and lever handle second tooth to mesh fully with chassis rack member first tooth, such that chassis rack member first tooth is fully disposed between said lever handle first tooth and said lever handle second tooth.

4. An avionics system of claim 1 wherein said lever handle and said lever handle first tooth and said lever handle second tooth are arranged with respect to each other to provide a pitch radius and a lever handle radius which are matched to provide a predetermined level of insertion forces for inserting said circuit card into said avionics LRU.

5. An avionics system of claim 3 wherein said lever handle and said lever handle first tooth and said lever handle second tooth are arranged with respect to each other to provide a pitch radius and a lever handle radius which are matched to provide a predetermined level of insertion forces and displacement for inserting said circuit card into said avionics LRU.

6. An avionics system of claim 5 herein said lever handle is made of extruded aluminum.

7. An avionics system comprising:

means for receiving a circuit card in translational motion;

a circuit card;

means for advancing and extracting said circuit card with respect to said means for receiving a circuit card;

said means for advancing including a rack means and a pinion means;

wherein said rack means includes a plurality of fixed teeth; and wherein said plurality of fixed teeth includes a wider tooth at a first end of said rack means.

8. An avionics system of claim 7 wherein said pinion means includes a multi-toothed pivoting member.

9. An avionics system of claim 8 wherein said multi-toothed pivoting member has an elongated handle thereon.

10. A system comprising:

a housing;

a circuit card, disposed in said housing, said circuit card having disposed thereon a lever handle which is coupled to said circuit card through a lever handle pivot pin;

mechanically coupled with said lever handle is a lever handle first tooth and a lever handle second tooth;

a chassis rack member disposed in said housing, said chassis rack member having a chassis rack member first tooth, and a chassis rack member second tooth thereon;

wherein said chassis rack member first tooth has a width characteristic which is in excess of a width characteristic of said chassis rack member second tooth;

wherein said lever handle first tooth and said lever handle are separated by an initial lever handle gap which is sufficiently large to allow lever handle and lever handle first tooth to be disposed on opposing sides of said chassis rack member first tooth; and, wherein said lever handle first tooth and said lever handle second tooth are separated by a second lever handle gap which is insufficient to permit lever handle first tooth and lever handle second tooth to mesh fully with chassis rack member first tooth, such that chassis rack member first tooth is fully disposed between said lever handle first tooth and said lever handle second tooth.

* * * * *